United States Patent [19]
Cibulsky et al.

[11] Patent Number: 5,378,306
[45] Date of Patent: Jan. 3, 1995

[54] COMPOSITE FOR PROVIDING A RIGID-FLEXIBLE CIRCUIT BOARD CONSTRUCTION AND METHOD FOR FABRICATION THEREOF

[75] Inventors: Michael J. Cibulsky, Binghamton; Konstantinos I. Papathomas, Endicott; William J. Summa, Endwell; David W. Wang, Vestal; Patrick R. Zippetelli, Endwell, all of N.Y.

[73] Assignee: International Business Machines Corporation, Armonk, N.Y.

[21] Appl. No.: 192,736

[22] Filed: Feb. 7, 1994

Related U.S. Application Data

[62] Division of Ser. No. 913,101, Jul. 14, 1992, Pat. No. 5,288,542.

[51] Int. Cl.⁶ .............................. B44C 1/22; C23F 1/00
[52] U.S. Cl. .................................... 156/630; 156/634; 156/656; 156/902
[58] Field of Search ................ 156/630, 634, 656, 902

[56] References Cited

U.S. PATENT DOCUMENTS

| | | | |
|---|---|---|---|
| 4,480,288 | 10/1984 | Gazdik et al. | 361/398 |
| 4,533,787 | 8/1985 | Anderegg et al. | 174/68.5 |
| 4,626,462 | 12/1986 | Kober et al. | 428/137 |
| 4,634,631 | 1/1987 | Gazit et al. | 428/421 |
| 4,687,695 | 8/1987 | Hamby | 438/192 |
| 4,715,928 | 12/1987 | Hamby | 156/630 |
| 4,725,484 | 2/1988 | Kumagawa et al. | 428/220 |
| 4,781,969 | 11/1988 | Kobayashi et al. | 428/209 |
| 4,800,461 | 1/1989 | Dixon et al. | 156/629 X |
| 4,847,146 | 7/1989 | Yeh et al. | 428/332 |
| 4,851,613 | 7/1989 | Jacques | 174/68.5 |
| 4,931,134 | 6/1970 | Hatkevitz et al. | 156/630 |
| 4,961,806 | 10/1990 | Gerrie et al. | 156/252 |
| 5,004,639 | 4/1991 | Desai | 156/902 X |
| 5,049,434 | 9/1991 | Wasulke | 428/202 |
| 5,072,074 | 12/1991 | DeMaso et al. | 174/254 |
| 5,100,492 | 3/1992 | Kober et al. | 156/250 |
| 5,108,825 | 4/1992 | Wojnarowski et al. | 428/209 |
| 5,142,448 | 8/1992 | Kober et al. | 361/398 |
| 5,144,534 | 9/1992 | Kober | 361/398 |
| 5,144,742 | 9/1992 | Lucas et al. | 29/830 |
| 5,175,047 | 12/1992 | McKenney et al. | 428/209 |

FOREIGN PATENT DOCUMENTS

0427702A2  5/1991  European Pat. Off. .
52-146489  12/1977  Japan .

OTHER PUBLICATIONS

Brochure from Upilex on polyimide films for elec. circuitry.
IBM Disclosure Bulletin vol. 28, No. 12, May 1986.

*Primary Examiner*—William Powell
*Attorney, Agent, or Firm*—Pollock, Vande Sande & Priddy

[57] ABSTRACT

A rigid-flexible circuit board is fabricated by providing a core having a dielectric substrate and conductive layer thereon. A sub-composite comprising a polyimide and rigid dielectric substrate adjacent the conductive layer and in both the rigid and flexible segments of the board is provided. A release layer corresponding to the flexible segment of the board is provided. A rigid bonding layer is provided at rigid segments of the board but not at the flexible segments. A composite is formed by providing a second conductive layer adjacent the rigid bonding layer. The composite is laminated. Portions of the second conductive layer corresponding to the flexible segment and release layer are removed.

13 Claims, 4 Drawing Sheets

COMPOSITE FOR PROVIDING A RIGID-FLEXIBLE CIRCUIT BOARD CONSTRUCTION AND METHOD FOR FABRICATION THEREOF

This is a divisional application of Ser. No. 07/913,101, filed on Jul. 14, 1992, now U.S. Pat. 5,288,542.

DESCRIPTION

1. Technical Field

The present invention is concerned with a composite for providing a rigid-flexible circuit board construction. In addition, the present invention is concerned with a method for the fabrication of a rigid-flexible printed circuit board. The present invention significantly reduces problems associated with excessive thermal expansion of certain constituents of the circuit board as experienced in prior art configurations. The present invention provides for compact flexible multi-layer circuits.

2. Background Art

Printed circuit boards find a wide variety of uses in the electronics industry with the demand for high performance, printed wiring, or circuit boards for various applications steadily increasing. For instance, the complexity, compactness and electrical performance requirements of printed circuit boards have significantly increased over the last few years. To meet the demands of high performance along with minimum space and weight requirements, both multi-layer and rigid-flex circuits have been employed. The rigid-flex printed circuit boards typically are made by individual flexible layers and rigid layers layed-up together to form a multi-layer construction.

The flexible layers are typically an integral part of both the rigid portions; and flexible portions of the printed circuit board. The rigid layers are part of only the rigid segments of the printed circuit boards. A typical material used for the flexible layers is the polyimide available under the trade designation Kapton from DuPont as the dielectric polymer film. In addition, the flexible layer typically includes an acrylic adhesive covering the Kapton in order to secure adequate bonding to the core or base dielectric and conductive layer such as copper.

The rigid segments of the rigid-flex printed circuit boards are typically formed of reinforced epoxy or reinforced polyimide laminate. In addition, acrylic adhesive is also typically used to bond the rigid and flexible layers together. Although, the acrylic adhesive exhibits excellent flexibility and heat resistance, problems have been encountered due to its high coefficient of thermal expansion as compared to copper, the dielectric core, and solder such as tin/lead solder that might be present in attaching integrated circuit chips to the board. These problems occur when the constructions are subjected to accelerated thermal cycling where the acrylic adhesive expands and contracts at a very high rate as compared to the other materials employed in fabricating the printed circuit board. The high expansion creates a great deal of stress in plated through holes and results in cracking in the walls of the through holes.

One attempt to overcome this problem is described in U.S. Pat. No. 4,800,461 to Dixon et al. This patent refers to a multi-layer rigid flex printed circuit board obtained by providing structures having rigid sections that incorporate materials which when subjected to elevated temperatures do not expand sufficiently in the Z direction to cause problems such as de-lamination and cracking of plated through holes. The flex section of these boards include flexible material that extend less than 35 mils in the rigid section and does not penetrate throughout the rigid section of the board. The insulator material of the flex segment is typically constructed of Kapton having an acrylic adhesive thereon for adhesion to the dielectric core and the small segment of overlap with the rigid segments of the board. However, such construction is not entirely satisfactory since the presence of the acrylic adhesive still remains in the flexible segments of the board and to some extent, although significantly reduced, in the rigid segments of the boards. Accordingly, the problems associated with high thermal expansion are still not entirely eliminated in such configuration.

SUMMARY OF INVENTION

The present invention provides composites that are suitable for fabricating rigid-flexible multi-layer circuit boards which overcome problems associated with the high thermal expansion due to the acrylic or similar adhesives. In fact, the composite of the present invention does not require the use of an acrylic or similar type adhesive in any portion of the printed circuit board including the rigid and flexible segments thereof. The characteristics achieved from circuit boards pursuant to the present invention with respect to performance, space and weight requirements, render the boards especially suitable for miniature electronic packaging.

More particularly, the present invention is concerned with a composite for providing a rigid-flexible circuit board construction that includes at least one core; at least one sub-composite; at least one release layer; at least one rigid bonding layer; and at least one conductive layer.

The core comprises a dielectric substrate and at least one conductive layer located on the dielectric substrate. The sub-composite comprises a polyimide and a rigid dielectric substrate. The sub-composite is located adjacent the at least one conductive layer of the core. The at least one release layer is located adjacent the at least one sub-composite and is located in a predetermined location to generally correspond to the desired flexible segment of the circuit board. Located adjacent to both sides of the at least one release layer is at least one rigid bonding layer that is to correspond to the desired rigid portion of the circuit board. The at least one second conductive layer is located adjacent the at least one bonding layer and the at least one release layer.

In addition, the present invention is concerned with a rigid-flexible circuit board construction that comprises at least one core; at least one sub-composite; at least one rigid bonding layer; and at least one second conductive layer.

The at least one core includes a dielectric substrate and at least one conductive layer located on the dielectric substrate. The sub-composite is located adjacent the at least one conductive layer of the core and is located in both the rigid and flexible segments of the circuit board. The sub-composite includes a polyimide and a rigid dielectric substrate. The at least one bonding layer is located adjacent the at least one sub-composite and at the rigid segments of the printed circuit board but not at the flexible segments thereof. The at least one second conductive layer is located adjacent the at least one rigid bonding layer.

The present invention is also concerned with a process for fabricating a rigid-flexible circuit board. The process includes providing at least one core that includes a dielectric substrate and at least one conductive layer located on the dielectric substrate. At least one sub-composite comprising a polyimide and a rigid dielectric substrate is provided and is placed adjacent the at least one conductive layer in those segments of the circuit board that will subsequently form the rigid and flexible segments of the circuit board. A release layer is provided adjacent the at least one sub-composite in a location to correspond generally to that segment of the circuit board which is to be the flexible segment of the circuit board. Adjacent the ends of the release layer is provided at least one rigid bonding layer located in those segments of the circuit board that are to provide the rigid segments of the circuit board but not at those segments which are to provide the flexible segments of the circuit board. A second conductive layer is provided adjacent the at least one rigid bonding layer to thereby form a composite.

The composite is then laminated. Portions of the second conductive layer that correspond to the subsequently to be formed flexible segment of the circuit board are removed and then the release layer is removed to thereby provide the desired rigid-flexible circuit board.

BEST AND VARIOUS MODES FOR CARRYING-OUT INVENTION

Figure 1:
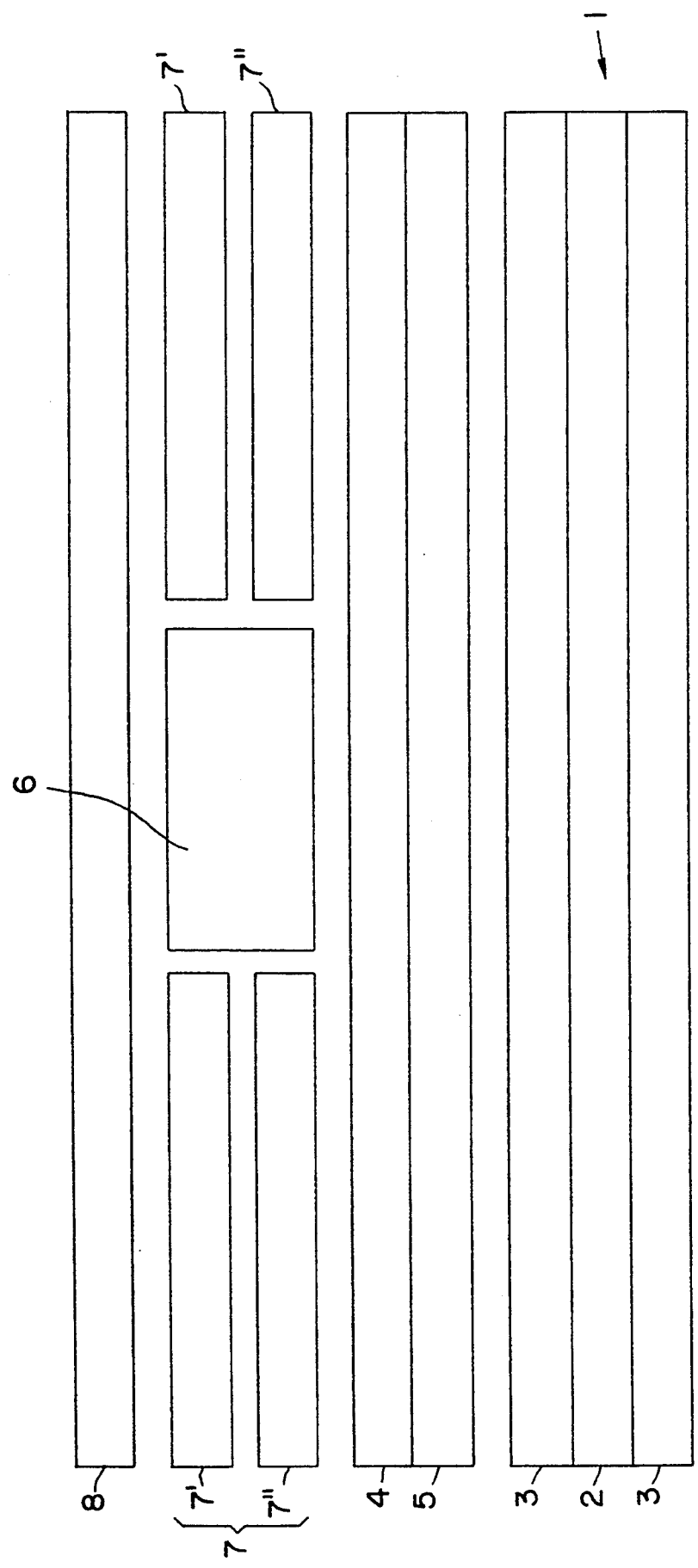
FIGS. 1-3 are schematic representations of the composite of the present invention during various stages of fabrication.

In order to facilitate an understanding of the present invention, reference is made to the figures wherein the same numerals in different figures refer to the same or corresponding structures. Reference to FIG. 1 illustrate a core member 1 that comprises a dielectric substrate 2 having at least one and preferably two opposed conductive layers thereon such as copper. The dielectric substrate 2 of the core is typically a cured fiberglass reinforced epoxy resin composition, more typically an FR-4 composition including those disclosed in U.S. Pat. Nos. 3,523,037, 4,597,996, disclosures of which are incorporated herein by reference. The thickness of the dielectric portion is typically about 3 mils to about 6 mils and preferably about 3.6 mils to about 5.6 mils. In a specific embodiment the dielectric substrate of the core is composed of two sheets, each being 1.8 mils, laminated together. In place of an epoxy, the dielectric of the core can be a polyimide film (e.g.—Upilex SGA available from UBE Ltd.) Such is a polyimide obtained from biphenyltetracarboxylic dianhydride and a diamine. Such has a typical repeating unit as follows:

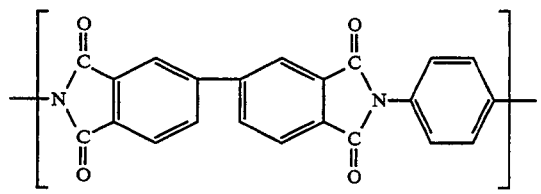

Moreover, the dielectric substrate of the core can be a flexible non-reinforced substrate such as a composite of Upilex SGA (e.g.—about 1-2 mils) coated on the surface or surfaces that are to contact the conductive layer with an epoxy (e.g.—about 0.5 to about 0.75 mils) such as those disclosed above. The epoxy provides for a tenacious bond with the conductive layer such as the copper.

A typical FR-4 epoxy composition contains 70-90 parts of brominated polyglycidyl ether of bisphenol-A and 10-30 parts of tetrakis(hydroxyphenyl) ethane tetraglycidyl ether cured with 3 to 4 parts of dicyandiamide, and 0.2 to 0.4 part of a tertiary amine, all parts being parts by weight per 100 parts of resin solids.

Another typical F-4 epoxy composition contains:
(a) about 25 to about 30 parts by weight of a tetrabrominated diglycidyl ether of bisphenol-A having an epoxy equivalent weight of about 350 to about 450;
(b) about 10 to about 15 parts of weight of a tetrabrominated diglycidyl ether of bisphenol-A having an epoxy equivalent weight of about 600 to about 750; and
(c) about 55 to about 65 parts by weight of at least one epoxidized nonlinear novalak having at least six terminal epoxy groups, along with suitable curing and/or hardening agents.

Another typical FR-4 epoxy composition contains 70-90 parts of brominated polyglycidyl ether of bisphenol-A and 10-30 parts of tetrakis (hydroxyphenyl) ethane tetraglycidyl ether cured with 0.8-1 phr of 2-methylimidozale. Still other FR-4 epoxy compositions employ tetrabromobisphenol A as the curing agent along with 2-methylimidazol as the catalyst.

The conductive layer 3 is preferably copper and typically has a thickness of about 0.5 to about 2.8 mils and more typically about 1.0 to about 1.4 mils. In addition according to preferred aspects of the present invention, the conductive layer comprises a layer of chromium contacting the dielectric followed by a layer of copper. The chromium is typically about 200 angsttoms to about 700 angsttoms thick and more typically about 300 angstroms to about 500 angsttoms thick with the copper being about 0.5 mil to about 2.8 mil thick and more typically about 1.0 mil to about 1.4 mil thick. The conductive layer 3 is patterned by well known lithographic techniques to form desired circuitry thereon.

Adjacent the conductive layer 3 of core 1 is provided at least one sub-composite. The sub-composite comprises a polyimide layer 4 and a rigid dielectric substrate layer 5. The preferred polyimide layer 4 is Upilex SGA and the rigid dielectric substrate layer 5 is preferably an epoxy composition such as an epoxy composition described in U.S. Pat. Nos. 3,523,037 and 4,597,996. The epoxy composition at this stage is in the B-stage which is about 30% to about 50% cross-linked.

The polyimide is typically about 0.5 mil to about 5 mils and more typically about 0.8 mil to about 2 mils.

The rigid dielectric substrate 5 is about 0.5 mil to about 1 mil and more typically about 0.5 mil to about 0.75 mils. The sub-composite is provided adjacent the conductive layer 3 on the dielectric substrate and is provided in those regions which are to be subsequently used as both the rigid and flexible regions of the printed circuit board. In addition, the sub-composite can be provided as a previously combined unit of the polyimide and epoxy polymer or can be applied as individual layers at this stage of the process if desired.

The epoxy polymer composition is adjacent the conductive layer 3 in order to ensure a tenacious bond between the sub-composite and conductive layer.

Next, a release layer 6 is provided adjacent the sub-composite. The release layer 6 is typically a material that is relatively non-adherent to the polyimide and to the subsequently to be applied layers or is readily removable therefrom. Typical materials include fluorinated polymeric materials such as fluorinated ethylene/propylene copolymers, polymers of chlorotrifluoroethylene, hexafluoropropylene polymers, polyvinylidene fluoride and polytetrafluoroethylene and polyfluoroalkoxyethylene.

A preferred release layer comprises a metal such as copper or brass to provide sufficient rigidity or stability coated with a relatively non-adhering material such as polytetrafluoroethylene or preferably polyfluoralkoxyethylene. The release layer 6 is located only in that area which corresponds generally to the segment which is to provide the flexible segment of the printed circuit board.

The release layer is typically about 5 to about 15 mils and more typically about 9.6 mils. In a preferred embodiment, the release layer comprises 1 sheet of copper about 5.6 mils thick and clad on each side with 2 mils of a polyfluoroalkoxyethylene. The release layer is critical to the success of the present invention to provide for instance adequate pressure at the flexible locations of the circuit board.

Adjacent to each end of release layer 6 is at least one rigid bonding layer 7. Typical bonding layers 7 are glass fiber reinforced epoxy polymer compositions such as those described in U.S. Pat. Nos. 3,523,037 and 4,597,996. The rigid bonding layers at this stage in the process are in the B-stage. Alternatively, the bonding layer can be a combination of a polyimide such as Upilex SGA coated both sides with the B-staged epoxy. Preferably the thickness of the rigid bonding layer is substantially equal to the thickness of the release layer and preferably is comprised of two separate layers 7' and 7" as illustrated in FIG. 1.

The rigid bonding layer is to be present in those portions of the composite which is to provide for the rigid segments of the printed circuit boards but not in those portions which are to provide the flexible segments of the printed circuit board.

A second conductive layer 8 is provided adjacent the rigid bonding layer 7 and the release layer 6. The second conductive layer is typically about 0.7 to about 1.4 mils thick.

Next, the assembly is laminated under pressure and heat to provide a laminated composite. Typically, the lamination is carried out at a temperature of about 340° to about 390° F. and more typically at about 350° to about 375° F. and preferably at about 350° F. and at pressures of about 200 to about 700 psi and more typically at pressures of about 300 to about 500 psi and preferably at about 350 psi. The lamination is generally continued for about 60 to about 120 minutes, typical of which is about ninety (90) minutes.

After the lamination is completed, the external circuitry on conductive layer 8 is provided as well as plated through holes 9. The structure can then be cleaned and any components to be connected to the rigid segments of the printed circuit board can be provided.

Next, that portion of the conductive layer 8 as well as any other layers located above spacer 6 which correspond to that portion of the composite which is to provide the flexible segments of the printed circuit board are removed. For instance, such materials can be removed by controlled depth milling. A typical milling procedure can be carried out using a Posalux or Radol milling machine.

Next, the release layer is removed.

In the preferred aspects of the present invention, release layer 6 can be removed by flexing the structure and permitting release layer 6 to merely fall out. In less preferred embodiments, when the release layer 6 adheres to an adjacent layer such as conductive layer 8, it can be removed by physical means such as milling or possibly by etching.

Figure 3:
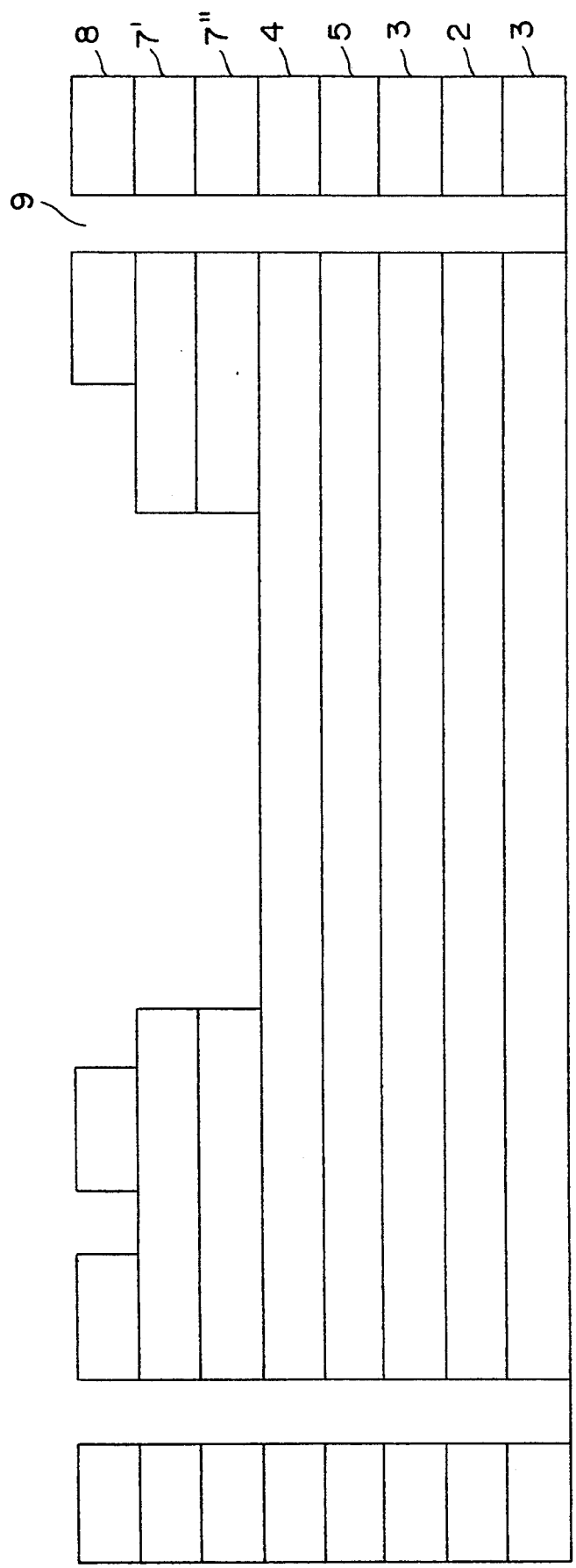

The flexible-rigid printed circuit board obtained is schematically illustrated in FIG. 3.

Figure 2:
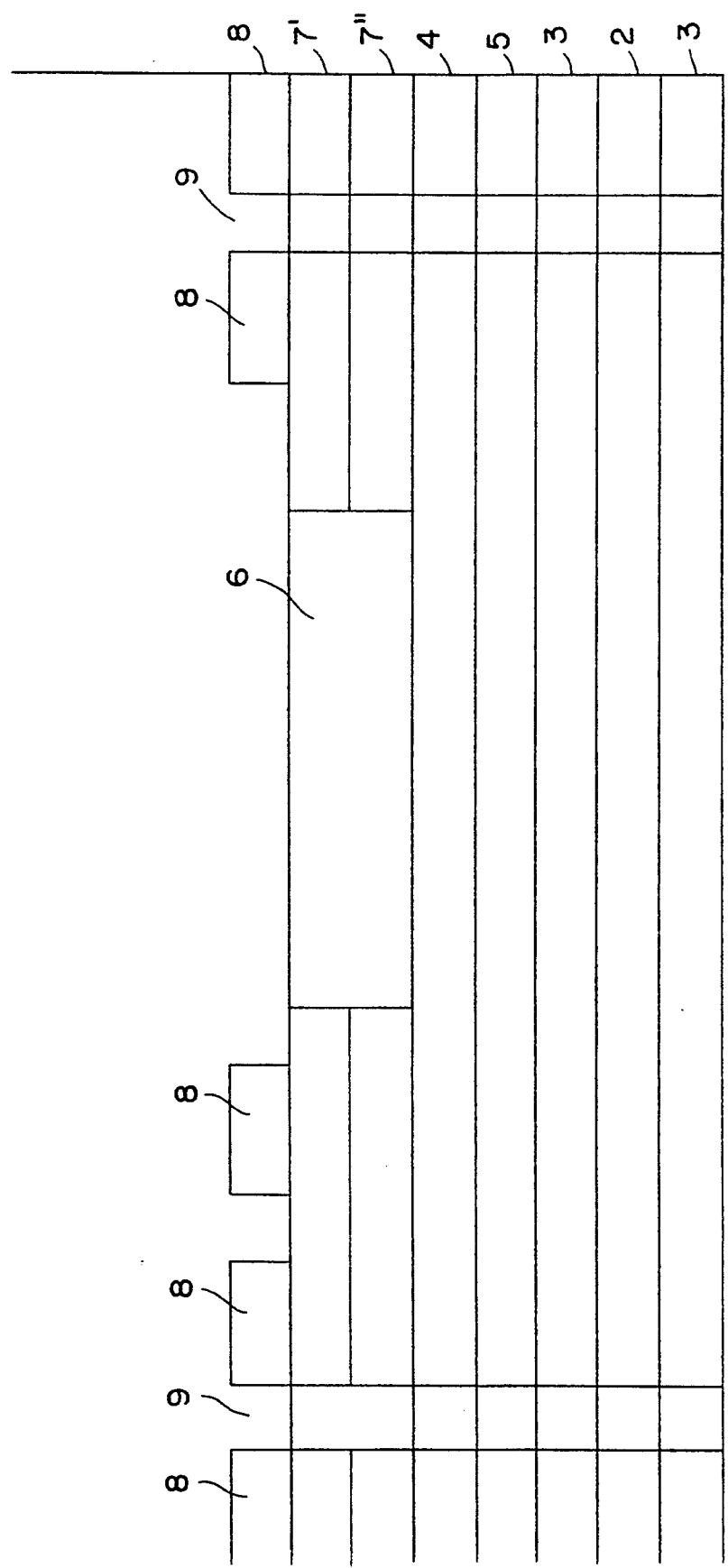
Figure 4:
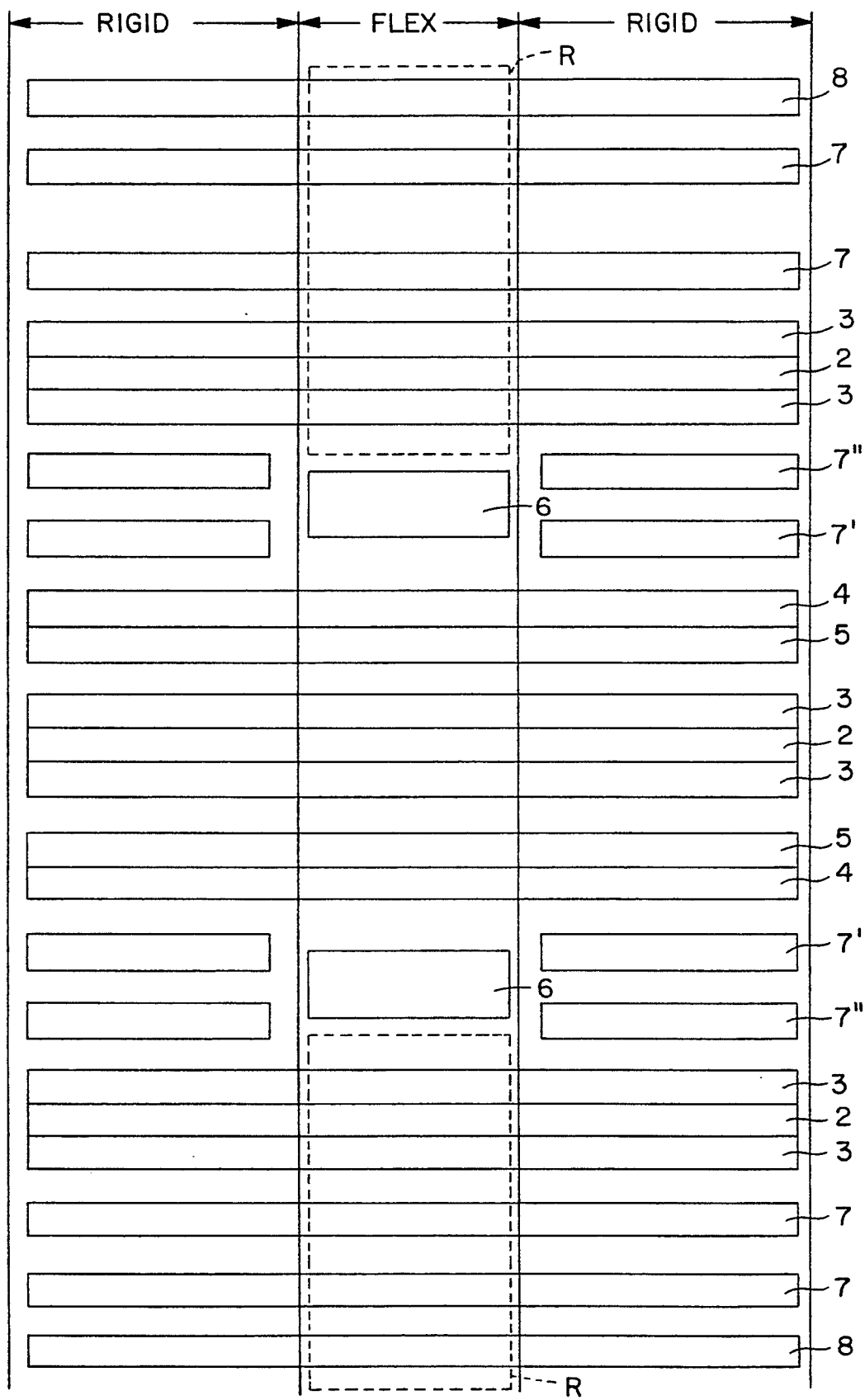
FIG. 4 illustrates a composite employing a plurality of cores and release layers pursuant to the present invention.

FIG. 4 represents a composite prior to lamination employing a plurality of cores (three (3) cores) with interim release layers 6 and bonding layers 7. The composite is processed in the same manner as described above for that shown in FIGS. 1 and 2 except that in the removal step prior to removal of the spacer, that region designated as R is removed.

As noted above, the present invention makes it possible to provide a rigid-flexible printed circuit board that does not require an acrylic or other adhesive layer having relatively high thermal expansion of above 300 ppm/° C. and especially in the rigid segments and thereby avoids problems associated in the prior art due to the high thermal expansion of such. However, although not required or even desired, acrylic or similar adhesives can be tolerated in the flexible segments without adversely affecting the composite to an undesired extent. Moreover, this is achieved pursuant to the present invention in a manner that employs relatively little real estate thereby providing a very compact printed circuit board that is especially suitable in miniature electronic packaging.

What is claimed is:

1. A process for fabricating a rigid-flexible circuit board comprising:
   (a) providing at least one core which comprises a dielectric substrate and at least one conductive layer located on said dielectric substrate;
   (b) providing at least one sub-composite which comprises a polyimide and a rigid dielectric substrate adjacent said at least one conductive layer and in both the rigid and flexible segments of said circuit board;
   (c) providing a release layer adjacent said at least one sub-composite in a location to correspond to the desired flexible segment of said circuit board;
   (d) providing at least one rigid bonding layer located adjacent said at least one sub-composite and at the rigid segments of said board but not at the flexible segments of said board;

(e) providing a second conductive layer adjacent said at least one rigid bonding layer to thereby form a composite;

(f) laminating said composite;

(g) removing portions of said second conductive layer that correspond to the flexible segment of said circuit board; and, (h) then removing said release layer to thereby provide said rigid-flexible circuit board.

2. The process of claim 1 wherein said dielectric substrate is a reinforced epoxy composition or polyimide film.

3. The process of claim 1 wherein said dielectric substrate is a flexible substrate.

4. The process of claim 3 wherein said flexible substrate comprises a combination of at least one layer of a polyimide film and at least one layer of an epoxy composition and wherein said epoxy composition contacts said at lest one conductive layer.

5. The process of claim 4 wherein said polyimide is obtained from biphenyltetracarboxylic dianhydride and diamine.

6. The process of claim 2 wherein said polyimide is obtained from biphenyltetracarboxylic dianhydride and a diamine.

7. The process of claim 1 wherein the polyimide of said subprocess is obtained from biphenyltetracarboxylic dianhydride and diamine; the rigid dielectric substrate of said subprocess is an epoxy composition wherein said epoxy composition contacts said conductive layer of said core.

8. The process of claim 1 wherein said release layer comprises a metal substrate coated with a fluorinated polymer.

9. The process of claim 8 wherein said metal substrate is copper.

10. The process of claim 1 wherein said rigid bonding layers are reinforced epoxy compositions.

11. The process of claim 10 wherein the thickness of said rigid bonding layers is substantially equal to the thickness of said release layer.

12. The process of claim 1 wherein said second conductive layer is copper.

13. The process of claim 1 wherein said composite comprises a plurality of at least 3 cores with interim release layers and rigid bonding layers.

* * * * *